United States Patent [19]

Papaliolios

[11] Patent Number: 5,309,391
[45] Date of Patent: May 3, 1994

[54] SYMMETRICAL POLARIZATION ENHANCEMENT IN A FERROELECTRIC MEMORY CELL

[75] Inventor: Andreas G. Papaliolios, Sunnyvale, Calif.

[73] Assignee: National Semiconductor Corporation, Santa Clara, Calif.

[21] Appl. No.: 955,506

[22] Filed: Oct. 2, 1992

[51] Int. Cl.⁵ .................. G11C 11/22; G11C 16/06
[52] U.S. Cl. ............................. 365/145; 365/218
[58] Field of Search ............... 365/145, 45, 185, 218

[56] References Cited

U.S. PATENT DOCUMENTS

| | | | |
|---|---|---|---|
| 4,853,893 | 8/1989 | Eaton, Jr. et al. | 365/145 |
| 4,888,733 | 12/1989 | Mobley | 365/145 |
| 4,893,272 | 1/1990 | Eaton, Jr. et al. | 365/145 |
| 5,038,323 | 8/1991 | Schwee | 365/145 |
| 5,148,395 | 9/1992 | Sowards | 365/185 |
| 5,175,706 | 12/1992 | Edme | 365/45 |
| 5,198,994 | 3/1993 | Natori | 365/145 |

OTHER PUBLICATIONS

Ferroelectric Memories, *Science*, vol. 246, pp. 1400-1405, Dec., 1989, by James F. Scott, et al.

Primary Examiner—Eugene R. LaRoche
Assistant Examiner—Michael C. Kessell
Attorney, Agent, or Firm—Richards, Medlock & Andrews

[57] ABSTRACT

A two-transistor, single capacitor ferroelectric memory cell in which a stepped voltage is applied to the drive line for writing polarization states into the capacitor. The isolation transistors are driven into cut off during the intermediate voltage level of the drive line, thereby isolating the ferroelectric capacitor plates with a balanced voltage to enhance full polarization of the ferroelectric domains, irrespective of the polarization state.

20 Claims, 3 Drawing Sheets

SYMMETRICAL POLARIZATION ENHANCEMENT IN A FERROELECTRIC MEMORY CELL

TECHNICAL FIELD OF THE INVENTION

The present invention relates in general to the polarization of ferroelectric material for the long term retention of polarization states, and more particularly to the symmetrical polarization of ferroelectric capacitors in semiconductor memory cells.

BACKGROUND OF THE INVENTION

Ferroelectric crystals, including the PLZT, PZT, PLT, etc. types of material are well known as perovskites that can be polarized in one direction, or the other, and can maintain the polarization states in the absence of a voltage applied thereto. When the ferroelectric material is incorporated as a dielectric between capacitor plates, the polarization states can be stored, and remain in the polarization state without any voltage applied across the capacitor plates. When such type of capacitors are implemented in memory cells, a nonvolatile storage device is achieved. The combination of ferroelectric capacitors in a memory array allows a random access and high speed memory to be realized, where the data is stored in polarization states in a nonvolatile manner.

The use of ferroelectric material in semiconductor memories is not without various disadvantages. Ferroelectric and silicon material are not directly compatible, as the latter tends to become degraded or contaminated, unless various precautions are taken during the fabrication of the memory. U.S. Pat. No. 5,046,043 by Miller et al. discloses techniques for overcoming the problem of integrating ferroelectric material with silicon material. Another problem with ferroelectric material is that with high speed operation, such as occurs in semiconductor memories, the time period in which a voltage is actually applied across the plates of a ferroelectric capacitor is very small, often in nanoseconds, and thus the ferroelectric material does not become completely polarized during the write cycle. By this, it is meant that in high speed write cycles all or substantially all of the domains in the ferroelectric material do not become reoriented by the influence of the electric field applied across the ferroelectric material. It is a well known phenomenon that the longer the polarization voltage is applied across the ferroelectric material, the more complete the polarization of the domains in the material.

U.S. Pat. No. 4,893,272 discloses a technique for increasing the effective time period in which a polarization voltage is applied to one plate of the ferroelectric capacitor, although the actual polarizing pulse occurs in a very short period of time. The technique for writing a polarization state in the noted patent is to apply a drive pulse to the plate line of the memory cell, apply a word line signal to drive a switching transistor into a conductive state to connect the ferroelectric capacitor between the plate line and a bit line, and then remove the word line drive before removing the plate line signal to thereby isolate the voltage on the one capacitor plate. In this manner, the isolated voltage on the one capacitor plate tends to maintain a voltage across the ferroelectric material and improve retention of the polarization state, even after the plate line signal has been removed. However, the severe disadvantage of the method and structure disclosed in the noted patent is that only one polarization state is affected by the isolated voltage which is held in the capacitor plate for a longer period of time, while the other polarization state must achieve polarization during the short period of time in which the polarizing pulse is applied to the ferroelectric material, as the other plate of the capacitor is not isolated from the plate line. Thus, for all the memory cells in the patent that have been written to the one polarization state, the retention thereof is enhanced, while the other memory cells storing the other polarization state are subject to the traditional polarization retention problems. It can be appreciated that as the access speeds of memories become shorter, the polarization retention problem is exacerbated.

Another problem inherent with the polarization retention technique described in the U.S. Pat. No. 4,893,272 is that with only one plate of the ferroelectric capacitor isolated from the bit line, semiconductor substrate currents can be generated by the occurrence of switching signals on the nonisolated plate. In practice, this can present a substantial problem as the nonisolated plate of the ferroelectric capacitor is connected by a line to many other ferroelectric capacitors in the array. Hence, should zero volts be initially stored on the isolated ferroelectric capacitor plate with 5 volts applied to the nonisolated plate, and thereafter when the nonisolated plate is driven to zero volts, the isolated plate must necessarily experience a negative voltage of −5 volts. This situation can cause the generation of substrate currents which can lead to latch-up and other problems. This problem is especially serious when utilizing CMOS type of logic circuits.

From the foregoing, it can be seen that a need exists for a technique of providing symmetrical and balanced polarization states in a ferroelectric capacitor, irrespective of which state is to be stored. A further need exists for a technique of providing a high reliability memory where the polarization retention is enhanced by driving the ferroelectric capacitor with a very short pulse, and providing a voltage across both plates of the capacitor for an effectively longer period of time than the write cycle.

SUMMARY OF THE INVENTION

In accordance with the principles and concepts of the invention, a ferroelectric capacitor is provided with isolation devices connected to each plate of the capacitor, thereby isolating the capacitor from both the bit line and the drive line of the memory cell. In accordance with the preferred embodiment of the invention, the ferroelectric capacitor memory cell includes a drive line and a bit line, a ferroelectric capacitor, and two switching transistors, one for connecting each plate of the ferroelectric capacitor to the respective lines. Further, the control terminals of the transistors are driven together so that the transistors are driven into conduction and to cutoff together. In this manner, when the switching transistors are nonconductive, or cut off, the ferroelectric capacitor is entirely isolated from the drive line and from the bit line.

In accordance with another feature of the invention, ferroelectric material is polarized with traditional drive line voltages, but such voltage is reduced to about half before the word line signal is removed. This technique provides a balanced voltage across the ferroelectric capacitor, irrespective of the polarization state thereof. Once the word line signal is removed, both plates of the ferroelectric capacitor are entirely isolated from the drive line and bit line and other cells similarly accessed along the row of the array. The bit lines along the column can then be again driven by signals to access other cells connected thereto, without disturbing the voltage on either plate of the isolated capacitors.

BRIEF DESCRIPTION OF THE DRAWINGS

Further features and advantages of the present invention will become apparent from the following and more particular description of the preferred embodiment of the invention, as illustrated in the accompanying drawings in which like reference characters generally refer to the same or similar elements or functions throughout the views, and in which.

DETAILED DESCRIPTION OF THE INVENTION

Figure 1:
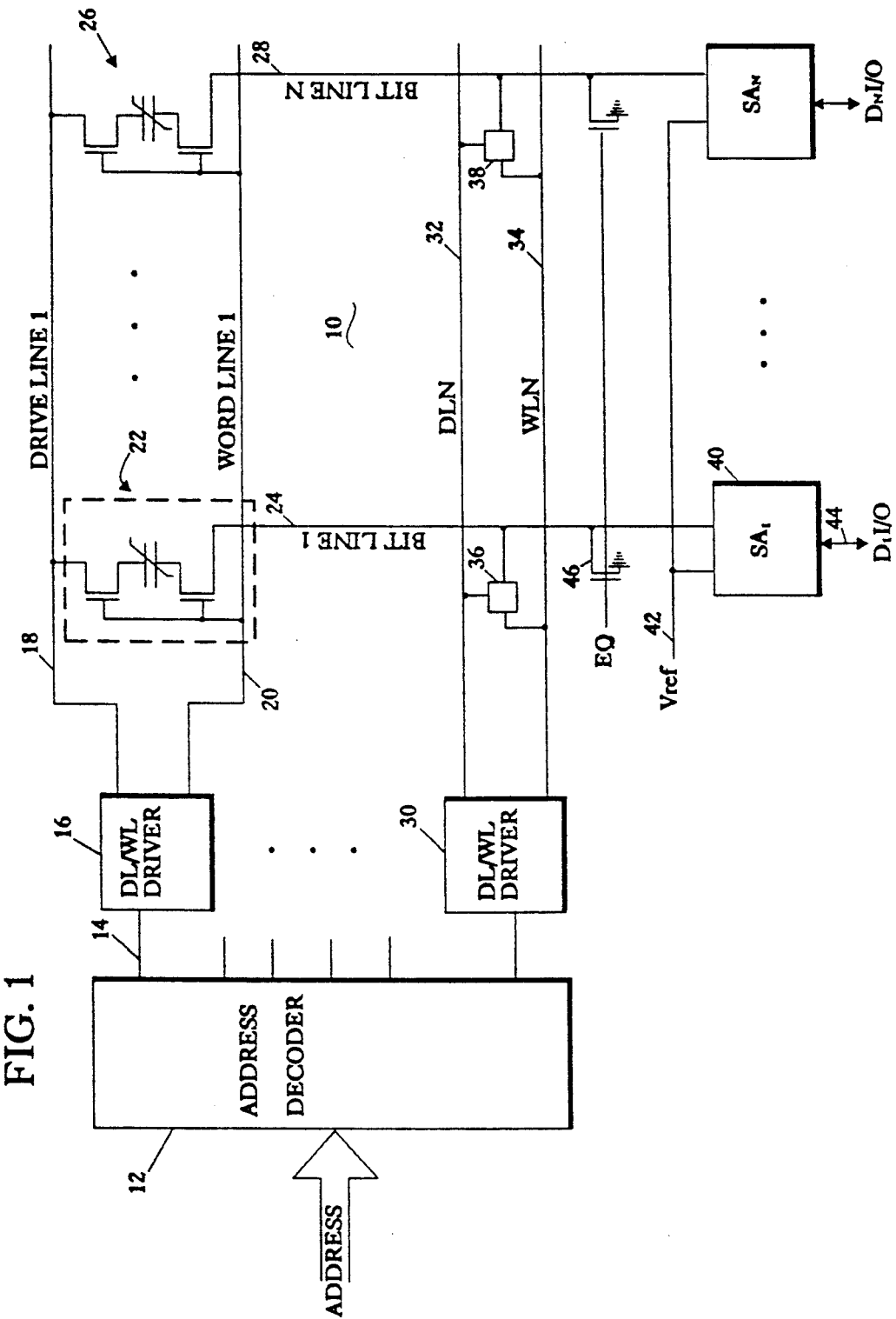
FIG. 1 is a detailed electrical schematic drawing of a ferroelectric memory array constructed according to the preferred embodiment of the invention.

FIG. 1 illustrates a ferroelectric memory array considered to be the preferred embodiment of the invention. It is to be understood that the principles and concepts of the invention may be utilized in applications other than memory circuits, and in circuits different from that shown herein. It should also be noted that while the array of FIG. 1 depicts the elementary circuits according to the invention, those skilled in the art will undoubtedly incorporate other well-known circuits essential to the operation of a semiconductor memory. The ferroelectric memory 10 according to the invention includes an address decoder 12 for receiving a number of addresses and decoding such addresses to select one of a number of output row lines, such as 14. The decoder output lines 14 are each associated with a row of the memory array for individually selecting and accessing each row to provide a readout of data therefrom. The decoder output line 14 is connected to a drive line-word line driver 16 for driving a respective drive line 18 that extends along the row of the memory array, and for driving a word line 20 which also extends along the row.

A memory cell 22 according to the invention is connected to the drive line 18, the word line 20, as well as a bit line 24 which extends in the direction of columns of the array. A number of other memory cells similar to memory cell 22 are connected in the row between the same drive line 18 and the word line 20, but are connected to different bit lines. For example, memory cell 26 is also connected to the drive line 18 and the word line 20, but is connected to a bit line 28. In this manner, when the drive line 18 and the word line 20 are driven with appropriate signals, readout signals from all the cells along the row are read onto the respective bit lines. In other words, if there are 64 memory cells associated with the word line 20 and drive line 18, then there will be 64 memory cells accessed and a corresponding 64 readout voltages. As can be appreciated, the bit lines 24 and 28 are utilized for reading the memory cell to obtain the data stored therein, as well as writing a polarization state into the ferroelectric capacitor of each cell along the row.

A drive line-word line driver 30 is associated with a different decoded output of the decoder 12 for driving a drive line 32 and a word line 34. Again, each memory cell, such as 36 and 38 associated with the row are connected to the same drive line 32 and word line 34, and are also connected to different bit lines 24 and 28 which extend in the column direction of the array. With this configuration, a plurality of rows and columns of cells can be arranged in an array, and each row can be independently accessed to write or read data therefrom. With both plates of each ferroelectric capacitor isolated, the activation of the bit lines by other accessed rows of the array has no affect on the isolated ferroelectric capacitors. As can be appreciated, since each cell 22 of the array includes two transistors, the density of the array is less than that of arrays having single-transistor, single-capacitor cells.

Each bit line of the array is connected to a respective sense amplifier, one of which is shown as reference character 40. The sense amplifier 40 is of conventional design, and of the race type, having one input connected to the bit line 24 and another input connected to a reference voltage 42. The reference voltage 42 is of a voltage preferably about midway between cell readout voltages of the one and zero levels. The sense amplifier 40 is provided with a data input/output (I/O) 44 for providing digital output signals corresponding to the polarization readout signals on the bit lines, as well as for providing digital states on the bit line for writing polarization states into the ferroelectric capacitors of the accessed cells. Also connected to each bit line is an equalization transistor 46 driven by an equalization (EQ) signal for discharging the bit lines prior to memory operations.

Figure 2A:
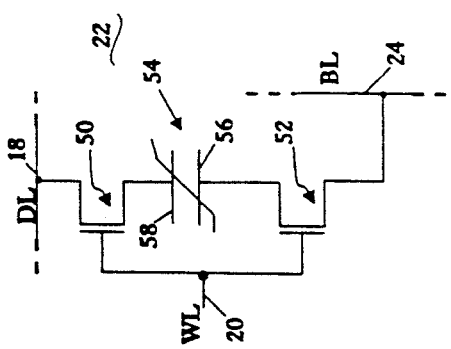
FIG. 2a is a schematic diagram of the memory cell according to the invention.
Figure 2B:
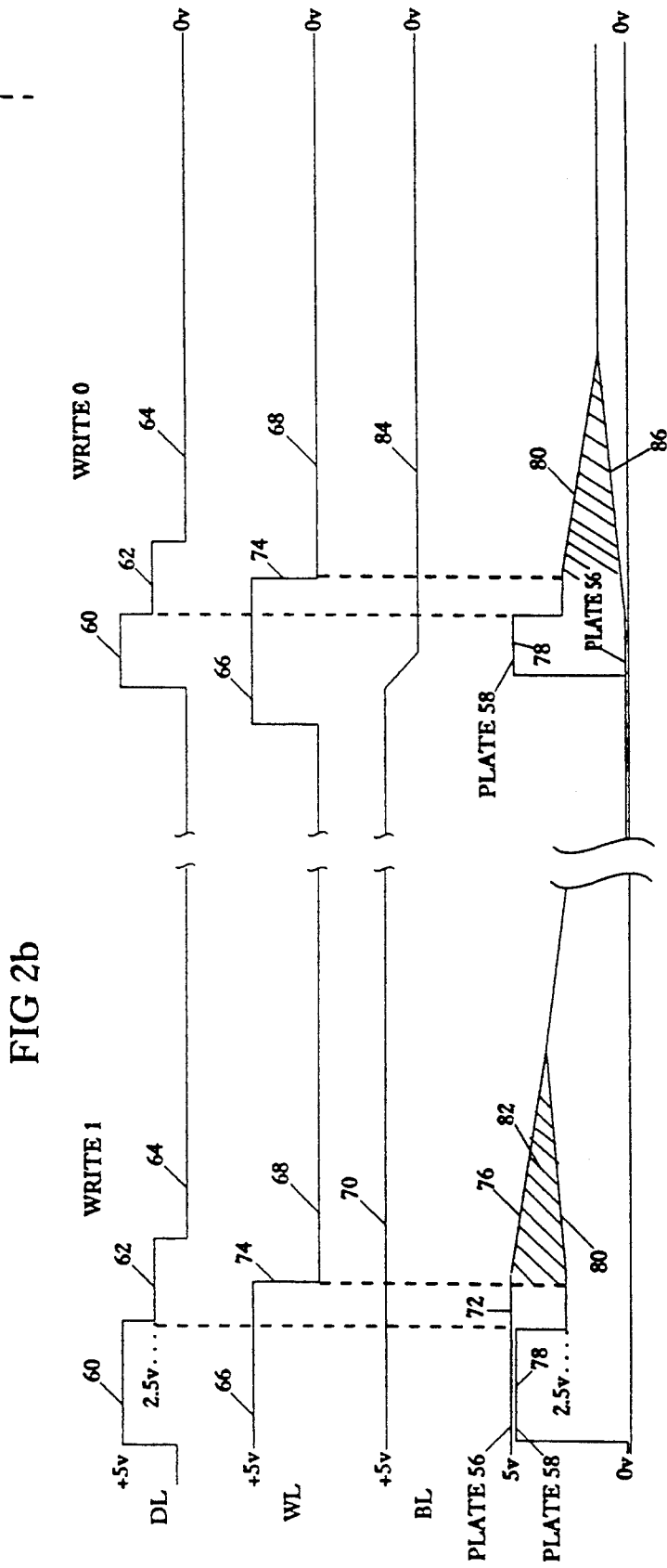
FIG. 2b illustrates a number of waveforms which depict the function and operation of the memory array of FIG. 1.

FIG. 2a illustrates the two-transistor, single-capacitor memory cell of the invention. FIG. 2b illustrates the voltages applied across the cell capacitor when it is written respectively with a one polarization state and a zero polarization state. In FIG. 2a, a transistor 50 is the switchable device for coupling the top plate 58 of the ferroelectric capacitor 54 to the drive line 18, while transistor 52 is the switchable device for coupling the bottom plate 56 of the capacitor to the bit line 24. The gate terminals of both transistors 50 and 52 are driven by the same word line 20, and thus both transistors are in conductive states or nonconductive states at the same time. When the word line 20 is driven to a logic high level, both transistors 50 and 52 are conductive, wherein the drive line voltage is applied to the top capacitor plate 58 and the bit line voltage is applied to the bottom capacitor 56 (less the threshold voltages of the switching transistors). When the word line 20 is driven to a logic low level, both the top capacitor plate 58 and the bottom capacitor 56 are isolated from the respective drive line 18 and the bit line 24.

The waveforms of FIG. 2b illustrate the signals for driving the memory cell 22 for writing a one polarization state and thereafter a zero polarization state in the ferroelectric capacitor 54. The drive line 18 is driven with a voltage that begins at the logic 5-volt level, but then drops to an intermediate level of about 2.5-volt and then later down to zero volts. The word line 20 is first driven with a 5-volt logic level, and then during the intermediate level of the drive line voltage the word line voltage transcends to the logic zero volt level. In writing a one polarization state, the bit line 24 is driven by the sense amplifier 40 to a logic 5-volt level, as shown by reference character 70. Because the lower plate 56 of the ferroelectric capacitor 54 is connected to the 5-volt level of the bit line 24, the capacitor plate 56 voltage 72 remains at a logic high level until the word line drive goes from a logic high level 66 to a logic low level 68. After the word line transition 74, transistor 52 is not conductive and a 5-volt level is trapped on the plate 56 of the ferroelectric capacitor 54. Because of the leakage path in the ferroelectric dielectrical material of capacitor 54, the voltage on capacitor plate 56 begins to decay, as shown by reference character 76. The initial time period for decay may be several hundred microseconds, which is a time period much longer than the entire memory write cycle, which may be less than 100 nanoseconds.

The voltage on the top capacitor plate 58 follows the drive line voltage from the 5-volt level down to the intermediate volt level. With a supply voltage of 5.0 volts and a transistor threshold voltage of about 1.0 volt, the intermediate voltage would preferably be about 2.0 volts. Again, when the word line voltage transition 74 occurs, the transistor 50 is cut off and the top capacitor plate 58 is isolated from the drive line 18. During the isolation time period 80, the 2.0-volt level that is trapped on the top capacitor plate 58 and the 4.0 level trapped on the bottom capacitor plate 56 reach an equilibrium voltage of about 3.0 volts that is somewhat between the respective voltages trapped on the plates. Depending on the dielectric constant of the ferroelectric material, the time to reach the equilibrium voltage may be several hundreds of microseconds. It is this time period during which an electrical field exists across the ferroelectric material that effectively extends the write cycle of the ferroelectric capacitor.

The shaded area 82 shown in the left part of FIG. 2b illustrates the voltage between the bottom capacitor plate 56 and the top capacitor plate 58 during the isolation period in which polarization retention is enhanced. Significantly, the bottom capacitor plate 56 is more positive than the top capacitor plate 58, thus providing a desired voltage polarity and magnitude of about 3.0 volts across the capacitor plates to establish the domains in the ferroelectric material in a direction representative of a one polarization state.

Importantly, FIG. 2b shows that for a long period of time after the word line transition 74, a voltage difference remains across the plates of the ferroelectric capacitor 54, thereby effectively increasing the writing time of the ferroelectric capacitor, although the actual write cycle is a very short period of time. After the voltage between the top capacitor plate 58 and the bottom capacitor plate 56 reaches equilibrium, i.e., a net zero voltage, the polarization enhancement is terminated as there is no electric field in the ferroelectric dielectric material and thus no electrical force to cause further domain alignment. With higher dielectric ferroelectric materials, the enhancement time period is longer. It should also be noted in FIG. 2b, that after the polarization enhancement period, the voltage on the ferroelectric capacitor plates gradually discharges through the various material leakage paths toward a zero volt or substrate voltage level. This latter time period may be tens to hundreds of milliseconds long, depending on the materials and semiconductor processes utilized to fabricate the circuit components. Of course, if the memory cell is accessed during this time period, the capacitor plates will again be charged to different voltages. The voltage decay periods shown in FIG. 2b are exaggerated for purposes of understanding.

The right hand portion of FIG. 2b illustrates the voltage waveforms utilized in driving the ferroelectric memory cell 22 for writing a zero polarization state into the ferroelectric capacitor 54. When writing a zero state in the ferroelectric capacitor 54, the drive line and word line voltages remain the same as in the previous example, except the bit line voltage is driven to zero volts, rather than 5 volts for writing the one polarization state, as shown by reference character 84. Because the drive line voltage is independent with respect to writing a one or zero voltage, the voltage on the top plate 58 of the ferroelectric capacitor 54 undergoes exactly the same changes as noted above in connection with writing a one polarization state, and is denoted with the same reference character. However, because the bit line voltage is driven to zero volts, it increases gradually toward an equilibrium of about 1.0 volt after being isolated. The polarization enhancement period is shown by reference character 86 during the second write cycle. When the transition 74 of the word line voltage occurs, the 2.0 volt level on the top capacitor plate 58 again begins to decay in the same manner noted above in connection with the writing of a one polarization state, but in this instance toward a 1.0 volt equilibrium level. The hatched area shown in the right hand part of FIG. 2b illustrates the decreasing voltage difference between the top capacitor plate 58 and the bottom capacitor plate 56 for writing a zero polarization state in the ferroelectric capacitor 54.

Importantly, it is noted that when writing the zero polarization state, the top capacitor plate 58 is more positive than the bottom capacitor plate 56, thereby aligning the domains in the ferroelectric material in an opposite direction. This voltage remains across the isolated ferroelectric capacitor 54 for a period of time much longer than the actual write cycle. Because a voltage is applied across the plates of the ferroelectric capacitor 54 for a longer period of time, more domains within the ferroelectric material are aligned, thus giving rise to a stronger polarization state stored therein. As in the example above, after the capacitor plates have reached an equilibrium voltage of about 1.0 volt, this voltage is gradually discharged by the leakage paths. It is also significant to note the voltage difference between the two capacitor plates is the same, or symmetrical, irrespective of the polarization state written into the ferroelectric material. Because the ferroelectric material experiences the same magnitude of electric field in either polarization state, neither state is favored, as is the case with the prior art enhancement technique. In the examples, the intermediate drive voltage was selected, based on an assumption that the ferroelectric memory as a whole achieves the storing of zero and one polarization states with equal effectiveness. However, if it is found that due to the type of ferroelectric material used, or because of processing idiosyncracies that one polarization is stored with a greater strength than the other state, the magnitude of the intermediate drive voltage can be skewed to favor the more weakly stored state during the enhancement period. In other words, the drive line drive circuit can be designed to shift the magnitude of the intermediate drive voltage so that the voltage across the capacitor plates is somewhat greater during the enhancement period when storing the weaker polarization state, as compared to the other polarization state. While the drive circuit components have not been schematically illustrated, those skilled in the art can readily devise semiconductor drive circuits for achieving the multiple voltage levels shown and described above.

It should be noted that because the effective writing voltage of the ferroelectric capacitor is less than the supply voltage, the coercive voltage of the ferroelectric material must be sufficient so that the hysteresis curve thereof is traversed to the extent that the material is sufficiently polarized to remain in a state when the voltage across the capacitor is removed.

As noted above, it is important to appreciate that in contrast to the polarization isolation technique disclosed in U.S. Pat. No. 4,893,272, the present invention allows not only a voltage to remain isolated across both of the plates of the ferroelectric capacitor 54 in both polarization states, but also the polarizing voltage utilized is of similar magnitude, but opposite in polarity, during the enhancement period in which the ferroelectric capacitor 54 is isolated. As noted above, this contrasts with the noted U.S patent where in one polarization state the full logic level is applied across the capacitor 54 and then isolated, and in the other polarization state no voltage is isolated across the ferroelectric capacitor 54. By utilizing an isolation transistor associated with each plate of the ferroelectric capacitor 54, and utilizing substantially a half supply drive voltage during the word line transition, balanced voltages are applied across the ferroelectric capacitor 54 in either the one or zero polarization state, thereby providing more balanced polarization states. Preferably, a drive line intermediate voltage of $(V_{CC}-V_{TH})/2$ is generated during the word line transition, where $V_{TH}$ is the threshold voltage of isolation transistor 50. By utilizing the principles and the concepts of the present invention, if any cell of the entire array tends to store an inherent weak zero or a weak one polarization state, the voltage isolated on the capacitor will effectively improve the storage of the polarization state and thus reduce memory array failures.

Figure 3:
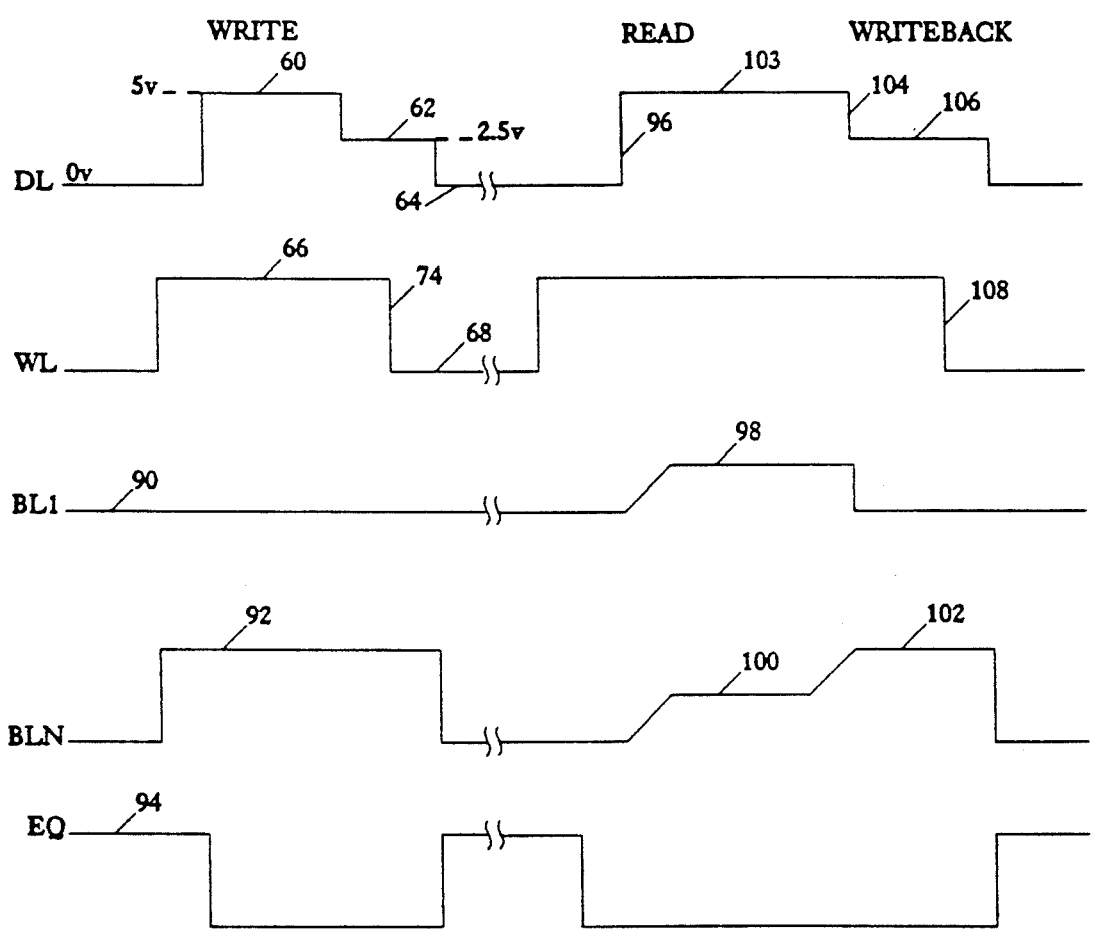
FIG. 3 is a collection of signals depicting the operation of the memory during a write cycle, a read cycle and a writeback cycle.

With regard to FIG. 3, there is illustrated a number of memory operations that are typical in the use of a ferroelectric memory of the invention. In the example of FIG. 3, a write cycle is illustrated for writing a polarization state into the ferroelectric capacitor of the accessed cell. Thereafter, a read operation is carried out to read the polarization state, followed by a writeback operation to restore the original polarization state back into the cell. Because the read operation of a ferroelectric capacitor is destructive, it must be followed by a writeback cycle to restore the original polarization state back into the ferroelectric capacitor 54 of the cell 22.

According to another important feature of the invention, the stepped nature of the drive line voltage, i.e., the 5-volt level 60 followed by the intermediate level 62 and the circuit common voltage 64 allow different voltages to be applied across the ferroelectric capacitor 54. For example, when the word line voltage 66 is at a logic high level, thereby driving transistors 50 and 52 into conduction, a larger voltage magnitude is impressed across the ferroelectric capacitor 54 than during the time period when the drive line 18 is driven to an intermediate voltage level 62. The full voltage across the ferroelectric capacitor 54 during the initial part of the write cycle has the effect of revitalizing the ferroelectric capacitor material. It is known that when a higher than normal voltage is applied across a ferroelectric material, the domains therein tend to become revitalized and overcome the fatigue phenomenon known to exist in ferroelectric material. Hence, an added benefit to the invention is realized by using a stepped drive signal.

With regard to FIG. 3, there are shown the same drive line and word line signals occurring during the write operation as noted above in connection with FIG. 2b. In addition, the voltage on the bit line 24 is shown as BL1 and the voltage on the bit line 28 is shown as BLN. The bit line 1 voltage 90 is shown at a logic low level during the write cycle, while bit line N voltage 92 is shown at a logic high level, whereby the ferroelectric capacitors of the cells 22 and 26 are written with opposite polarization states. It should also be noted that prior to the write cycle, the equalization (EQ) signal 94 was a logic high, thereby driving the equalization transistors 46 into conduction and discharging the bit lines. During the write cycle itself, the equalization signal is at a logic low and the bit lines are allowed to be driven to voltages dependent upon the readout currents of the respective memory cells. Importantly, the drive line voltage is stepped during the write cycle with the supply voltage level 60 and intermediate voltage 62. The transition 74 on the word line occurs during the intermediate voltage level 62 of the drive line, whereby the ferroelectric capacitors of each cell are isolated with balanced voltages thereon, independent of the polarization states.

The read cycle is initiated by driving the word line to a logic high level which drives the pair of transistors of each cell along the row into conduction. The drive line includes a leading edge transition 96 to a high level, thereby pulsing the ferroelectric capacitors of the accessed cells. Depending upon the respective polarization state stored therein, difference quantities of electrical charge will be driven by the cells onto the respective bit lines. As noted with regard to bit line 1, the voltage 98 is small and insufficient to switch the sense amplifier. In contrast, the voltage 100 on the bit line N is greater that the reference voltage 44, thereby driving the associated sense amplifier to a logic high 102. When the drive line voltage transitions 104 to the intermediate voltage 106, the ferroelectric capacitors in the accessed cells are restored to their original polarization states. The drive line transistor 104 from voltage level 103 to level 106 denotes a writeback of the accessed cells. During the intermediate drive line voltage 106, the word line transitions los to a logic low level, thereby isolating each of the ferroelectric capacitors of the cells in the accessed row. Depending upon the polarization states restored into the ferroelectric capacitors of the row, the balanced and isolated voltages noted in FIG. 2b are captured across the capacitors, thereby effectively increasing the period of time over which the ferroelectric capacitors are written. After the writeback cycle, the drive line voltage and the word line voltage is at a logic low, while the equalization voltage is at a logic high to discharge the bit lines in preparation of a subsequent memory cycle.

From the foregoing, it can be seen that a new memory cell and operational technique have been disclosed for improving the storing capabilities of ferroelectric capacitors. By employing an isolation transistor associated with each plate of the ferroelectric capacitor, and operating the transistors in unison, voltages can be isolated on both plates of the capacitor for improving the domain alignment. Moreover, the isolated voltages are balanced and can be applied to each plate, irrespective of the polarization state stored. In addition, by utilizing a stepped drive line voltage, the initial voltage impressed across the ferroelectric capacitor is greater than the isolated voltage, thereby revitalizing the ferroelectric material and improving the long term retention characteristics. Because each plate of the ferroelectric capacitor is isolated from its respective drive or bit line, transitions on such lines do not affect the capacitors if the associated cells are not accessed. Further, cells not accessed do not give rise to substrate currents if the drive lines or bit lines undergo transitions that otherwise would generate capacitive induced negative substrate currents. Latch-up problems of CMOS memory circuits are also reduced.

While the preferred embodiment of the invention has been disclosed with reference to a specific memory cell structure and operation, it is to be understood that many changes in detail may be made as a matter of engineering choices without departing from the spirit and scope of the invention, as defined by the appended claims.

What is claimed is:

1. A ferroelectric memory, comprising: an array of memory cells, each cell having,
    a ferroelectric capacitor with a first plate and a second plate and ferroelectric material formed therebetween for storing either of two polarization states,
    a first isolation transistor for connecting the first plate of the ferroelectric capacitor to a drive line, and
    a second isolation transistor for connecting the second plate of the ferroelectric capacitor to a respective bit line,
    a word line address circuit for driving a gate terminal of the first and second isolation transistors of cells in a row;
    a drive line driver for driving a drive line connected to memory cells in the row, said drive line driver being adapted for driving the drive line with a first voltage level followed by a second, non-zero voltage level that has a magnitude less than the first voltage level; and
    wherein said word line address circuit terminates the drive to the gate terminals of the isolation transistors during a time period when the drive line is driven with the second voltage level, whereby the ferroelectric capacitors in an access row are polarized with a polarization state that is a function of a voltage of the respective bit line, and a voltage is isolated on either said first or second capacitor plate of the ferroelectric capacitors irrespective of a respective polarization state stored therein.

2. The ferroelectric memory of claim 1, wherein said drive line driver drives the drive line with a third voltage level that is less in magnitude than the second voltage level.

3. The ferroelectric memory of claim 2, wherein said second voltage level is substantially midway between the first and third voltage levels.

4. The ferroelectric memory of claim 1, wherein said second voltage level is of a magnitude about $(V_{CC}-V_{TH})/2$ where VCC is a supply voltage of the memory and $V_{TH}$ is a threshold voltage of one of the isolation transistors.

5. The ferroelectric memory of claim 1, wherein said drive line driver is active during a write operation and active during a writeback operation of memory.

6. The ferroelectric memory of claim 1, wherein a word line signal of said address circuit is characterized by a transition that places said isolation transistors in a nonconductive state to isolate the nonzero voltage on both the first and second plates of the ferroelectric capacitor.

7. A method of writing a memory cell of the type having a ferroelectric capacitor as a storage element, comprising the steps of:
    accessing the memory cell by driving a first isolation transistor into conduction to connect a first plate of the ferroelectric capacitor to a drive line, and driving a second isolation transistor into conduction to connect a second plate of the ferroelectric capacitor to a bit line;
    driving the drive line with a voltage having a first amplitude while said first and second isolation transistors are conductive, and thereafter driving the drive line with a voltage having a second nonzero amplitude that is less than the first amplitude; and
    placing the first and second isolation transistors into cutoff during a time when the drive line is driven with said second amplitude voltage.

8. The method of claim 7, further including driving the drive line to substantially a zero voltage level after termination of a word line drive to the first and second isolation transistors.

9. The method of claim 7, further including revitalizing the ferroelectric capacitor by applying thereto the first amplitude voltage while said first and second isolation transistors are conductive.

10. The method of claim 7, wherein said first and second amplitude voltages are applied to said ferroelectric capacitor during a writeback memory cycle after a memory read operation to thereby restore the memory cell to an original polarization state.

11. A method of writing to a ferroelectric cell of the type having a ferroelectric capacitor as a storage element, comprising the steps of:
    coupling a first plate of a ferroelectric capacitor to a drive line;
    coupling a second plate of the ferroelectric capacitor to a bit line;
    driving the bit line to one of a logic high or logic low voltage to polarize the ferroelectric capacitor to a desired polarization state;
    driving the drive line to a voltage having an amplitude that is intermediate the logic high and low voltage applied to the bit line; and
    isolating the first and second plates of the ferroelectric capacitor from the respective drive line and bit line while said drive line voltage and said bit line voltage are applied across the ferroelectric capacitor plates.

12. The method of claim 11, wherein said isolating step captures a nonzero voltage on each plate of the capacitor which remains for a period of time after the capacitor plates are isolated from the respective lines.

13. The method of claim 11, wherein said isolating step is carried out by removing a word line drive signal from control terminals of two transistors that are connected respectively between the first plate of the ferroelectric capacitor and the drive line, and the second plate of the ferroelectric capacitor and the bit line.

14. The method of claim 11, wherein said method is carried out during a write operation of the ferroelectric cell and during a writeback operation of the cell.

15. The method of claim 11, further including generating a stepped drive line voltage having three different voltage levels, and carrying o said isolating step during an intermediate one of said voltage levels.

16. A method of enhancing polarization states in a ferroelectric memory cell, comprising the steps of:
  writing a first polarization state in a ferroelectric capacitor of the memory cell by,
    a) applying a first polarizing voltage and polarity across.-the plates of the ferroelectric capacitor,
    b) isolating the ferroelectric capacitor plates so that a different voltage is trapped on each plate of the capacitor, and
    c) allowing the trapped voltages to reach a first equilibrium voltage during a first enhancement period to prolong an electric field in the ferroelectric material and enhance alignment of domains in a first direction in the ferroelectric material;
  writing a second polarization state in the ferroelectric capacitor of the memory cell by,
    d) applying a second polarizing voltage and polarity across the plates of the ferroelectric capacitor,
    e) isolating the ferroelectric capacitor plates so that a different voltage is trapped on each plate of the capacitor, and
    f) allowing the trapped voltages to reach a second equilibrium voltage different from the first equilibrium voltage during a second enhancement period to prolong an electric field in the ferroelectric material and enhance alignment of domains in a second direction in the ferroelectric material.

17. The method of claim 16, further including allowing the first and second equilibrium voltages decay over an extended period of time.

18. The method of claim 16, further including isolating voltages on the plates of the ferroelectric capacitor during the first and second enhancement periods that result in substantially equal electric fields in the ferroelectric material, but opposite in polarity.

19. The method of claim 16, further including applying different voltages to one plate of the ferroelectric capacitor when polarizing the ferroelectric material to different states, and applying the same voltage to the other plate of the ferroelectric capacitor irrespective of the state to which the ferroelectric material is polarized.

20. The method of claim 16, further including applying a three-state voltage to one plate of the ferroelectric capacitor for polarizing the ferroelectric material to either said first polarization state or said second polarization state, and wherein an intermediate state voltage of the three-state voltage is isolated on the one plate of the ferroelectric capacitor.

* * * * *

UNITED STATES PATENT AND TRADEMARK OFFICE
CERTIFICATE OF CORRECTION

PATENT NO. : 5,309,391
DATED : May 3, 1994
INVENTOR(S) : Andreas G. Papaliolios

It is certified that error appears in the above-indentified patent and that said Letters Patent is hereby corrected as shown below:

Col. 9, line 46, delete "access", insert --accessed--.

Col. 11, line 1, delete "o said", insert --out said--.

Col. 11, line 2, delete "one", insert --level--.

Col. 11, line 2, delete "voltage levels", insert --drive line voltage--.

Col. 11, line 8, delete ".-the".

Col. 12, line 7, after "voltages", insert --to--.

Signed and Sealed this

Twenty-fifth Day of October, 1994

BRUCE LEHMAN

*Attest:*

*Attesting Officer*        *Commissioner of Patents and Trademarks*